United States Patent [19]

Compaan

[11] Patent Number: 5,393,675
[45] Date of Patent: Feb. 28, 1995

[54] PROCESS FOR RF SPUTTERING OF CADMIUM TELLURIDE PHOTOVOLTAIC CELL

[75] Inventor: Alvin D. Compaan, Sylvania, Ohio

[73] Assignee: The University of Toledo, Toledo, Ohio

[21] Appl. No.: 59,559

[22] Filed: May 10, 1993

[51] Int. Cl.$^6$ ............... H01L 31/18; H01L 31/072; H01L 31/075; C23C 14/35
[52] U.S. Cl. ..................... 437/5; 136/260; 136/264; 136/265; 204/192.25; 204/192.26
[58] Field of Search ............ 437/4, 5, 234, 5; 204/192.25, 192.26; 1336/260, 264, 265; 257/78, 184, 201, 458, 461, 614, 656

[56] References Cited

U.S. PATENT DOCUMENTS

| | | | |
|---|---|---|---|
| 4,086,101 | 4/1978 | Jordan et al. | 136/258 |
| 4,095,006 | 6/1978 | Jordan et al. | 427/427 |
| 4,261,802 | 4/1981 | Fulop et al. | 437/5 |
| 4,265,933 | 5/1981 | Jordan et al. | 427/553 |
| 4,284,490 | 8/1981 | Weber | 204/298.08 |
| 4,331,707 | 5/1982 | Muruska et al. | 427/74 |
| 4,388,483 | 6/1983 | Basol et al. | 1336/260 |
| 4,392,931 | 7/1983 | Maniv et al. | 204/192.12 |
| 4,398,055 | 8/1983 | Ijaz et al. | 136/258 |
| 4,400,244 | 8/1983 | Kroger et al. | 205/50 |
| 4,415,427 | 11/1983 | Hidler et al. | 204/298.26 |
| 4,420,385 | 12/1983 | Hartsough | 204/192.23 |
| 4,465,575 | 8/1984 | Love et al. | 204/192.26 |
| 4,666,569 | 5/1987 | Basol | 205/123 |
| 4,680,611 | 7/1987 | Basol | 136/256 |
| 4,709,466 | 12/1987 | McCandless et al. | 437/5 |
| 4,710,589 | 12/1987 | Meyers et al. | 136/258 PC |
| 4,734,381 | 3/1988 | Mitchell | 437/5 |
| 4,753,684 | 6/1988 | Ondris et al. | 136/258 |
| 5,105,310 | 4/1992 | Dickey | 359/586 |
| 5,248,349 | 9/1993 | Foote et al. | 136/260 |
| 5,304,499 | 4/1994 | Bonnet et al. | 437/5 |

OTHER PUBLICATIONS

W. Muller et al, *Thin Solid Films*, vol. 59, pp. 327–336 (1979).

G. S. Sanyal et al, *Solar Energy Materials*, vol. 20, pp. 395–404 Jun. 1990.

B. E. McCandless et al, *Solar Cells*, vol. 31, pp. 527–535, Dec. 1991.

Y. Tyan et al, *Conference Record, 16th IEEE Photovoltaic Specialists Conf.* (1982), pp. 794–800.

*Primary Examiner*—Aaron Weisstuch
*Attorney, Agent, or Firm*—Marshall & Melhorn

[57] ABSTRACT

A thin film photovoltaic cell having a semiconductor layer of cadmium sulfide and a semiconductor layer of cadmium telluride is manufactured in a process in which the cadmium sulfide and the cadmium telluride are deposited onto a conductive layer of a substrate by RF sputtering. A layer of cadmium sulfide is deposited on the conducting layer of the substrate by RF magnetron sputtering. After the cadmium sulfide is deposited, a layer of cadmium telluride is deposited by RF magnetron sputtering. The RF sputtering deposition of the two semiconductor layers increases the efficiency of the cell and is conducive to a large scale manufacturing process. The photovoltaic cell may include only two semiconductor layers forming a p-n junction. A third semiconductor layer, typically zinc telluride, may be added to the cell to form a p-i-n junction. The efficiency of the cell is further increased by treatment with cadmium chloride and annealing in dry air. The cadmium chloride is deposited using laser-driven physical vapor deposition. The cell is then annealed at approximately 400 degrees Celsius in air prior to deposition of the second contact. The second contact is deposited using vacuum evaporation of copper and gold.

10 Claims, 1 Drawing Sheet

PROCESS FOR RF SPUTTERING OF CADMIUM TELLURIDE PHOTOVOLTAIC CELL

BACKGROUND OF THE INVENTION

1. Field of the Invention

The present invention relates; to photovoltaic cells and methods for making photovoltaic cells, and more particularly to RF sputtering for thin film cadmium telluride photovoltaic cells to improve efficiency and reduce production costs.

2. Summary of Related Art

Photovoltaic technology offers great potential as an alternative source of electrical energy. One of the main reasons that such potential has not yet been realized is the difficulty in making photovoltaic devices that efficiently transform light into electricity at a cost that is competitive with conventional energy sources. Researchers are continually striving to improve the efficiency and reduce the production costs of photovoltaic cells.

The standard photovoltaic cell includes a substrate for mounting the cell and two ohmic contacts/conductors for passing current to an external electrical circuit. The cell also includes two or three semiconductor layers in series. In addition to the n-type layer and the p-type layer of a two layer semiconductor cell, the three layer cell includes an intrinsic (i-type) layer positioned between the n-type layer and the p-type layer for absorption of light radiation.

The semiconductor layers may be formed from single crystalline materials, amorphous materials, or polycrystalline materials. Single crystal materials are the preferred material from an efficiency standpoint, with efficiencies over 20% available in certain single crystal photovoltaic systems. However, single crystal materials have significant drawbacks because of the high cost of material and the difficulty in depositing single crystal materials.

In considering amorphous materials, the carrier mobility and lifetime are low. While amorphous and single crystal materials are useful in the practice of photovoltaic cells, the polycrystalline materials are preferred.

For polycrystalline materials, there are a number of advantages during the production process. Researchers in the field desire to increase the efficiency of the polycrystalline materials from the current 1–10% efficiency to the 10–15% efficiency range, which is closer to the 20–25% range of the single crystal material.

Cadmium telluride is a semiconductor whose electronic properties have long been recognized as ideally suited for photovoltaic conversion of sunlight. Cadmium telluride is preferred for thin film photovoltaic applications because of its direct band gap and its ability to be doped n-type and p-type, which permits formation of a variety of junction structures.

However, there remains a continuing need for a more efficient and less expensive photovoltaic cell, and particularly for a more efficient cadmium telluride photovoltaic cell that is suitable for mass production volume. Much of the early research work regarding cadmium telluride solar cells was restricted to the use of a single crystal cadmium telluride, which is an expensive material obtained by slowly growing a crystal from a melt containing cadmium and tellurium.

More recent photovoltaic cell development work with cadmium telluride has included methods to improve the deposition of the cadmium telluride on the substrate. Examples of deposition procedures currently available include electrodeposition, chemical vapor deposition, close spaced sublimation, solid-gas reaction, spray pyrolysis, sputtering, liquid phase epitaxy, molecular beam epitaxy, and other techniques known in the art. The present invention encompasses a new and unique application of RF sputtering for depositing both cadmium sulfide and cadmium telluride in a photovoltaic cell.

In the processes shown in U.S. Pat. Nos. 4,086,101 and 4,095,006 to Jordan et al, photovoltaic cells have been formed by coating a hot sheet of glass, previously coated with a tin oxide, with a thin film of cadmium sulfide. The film of cadmium sulfide was formed by spraying the substrate with a solution comprising a solvent, a cadmium salt, a sulphur containing compound and an aluminum containing soluble compound. The spray process is conducted while the surface of the substrate is maintained at a temperate in the range of 500° F. to 1100° F. After the spray process is completed, the coated substrate is heated further and then cooled to room temperature. The cadmium sulfide is converted to copper sulfide by dipping the coated glass in a weak acid solution.

A third U.S. patent to Jordan et al., U.S. Pat. No. 4,265,933 includes the additional step of irradiating the layer of polycrystallian cadmium sulfide with intense ultra-violet light during processing.

In U.S. Pat. No. 4,261,802, Fulop et al. discloses an improved electrodeposition process for producing cadmium telluride photovoltaic cells. A cadmium telluride film is formed having a barrier layer on one side and a conductive layer on the other side. The cadmium telluride is electrodeposited from either an acidic or alkaline bath onto a substrate consisting of cadmium coated on a base substrate having a rest potential more positive than that of cadmium. The cadmium telluride film is treated by annealing and plasma etching or electrolytic treatment to produce modified crystalline characteristics. The cell disclosed in Fulop et al includes only two semiconductors, a cadmium surface layer and the cadmium telluride film.

U.S. Pat. No. 4,331,707 to Muruska et al discloses an additional method for forming a thin film of cadmium sulfide. The film of cadmium sulfide is fabricated by first depositing a layer of cadmium oxide by spray pyrolysis of a cadmium salt solution followed by annealing of the oxide layer at elevated temperature in the presence of a sulfide ion. The thermally induced ion exchange of the sulfur for oxygen produces a cadmium sulfide.

U.S. Pat. Nos. 4,388,483; 4,666,569; and 4,680,611 to Basol et al disclose an alternative means for electrodepositing a layer of semiconductor material and heating the film to create a low-resistivity p-type semiconductor compound. Also disclosed is a multi-layer ohmic contact for the p-type semiconductor. The Ohmic contacts have two metal layers, a first layer to provide a stable contact with the p-type semiconductor and a second layer to provide the electrical conductivity. Additional patents which disclose a process for fabricating thin film photovoltaic cells include U.S. Pat. Nos. 4,400,244 to Kroger et al for electrochemical deposition; 4,709,466 to McCandless for heat treating and then rapid cooling of the photovoltaic cell; and 4,734,381 to Mitchell for lead telluride deposited on cadmium telluride.

Several recent patents have disclosed p-i-n photovoltaic cells with three layers of semiconductors. The advantages of using three layers of semiconductors instead of two layers of semiconductors include the ability to choose materials with properties for each component of the device. Solar radiation is absorbed in the intrinsic layer, and photogenerated positive and negative charge carriers are field assisted to the p and n regions. Cadmium telluride is self-compensating and prefers to be intrinsic. The n-type layer generally consists of cadmium sulfide and the p-type layer generally consists of zinc telluride.

U.S. Pat. No. 4,753,684 Ondris et al. teaches a three semiconductor layer structure prepared by electrodeposition. The process disclosed includes three electrodeposition baths with process temperatures less than 100 degrees Celsius and with limited exposure time between the three baths. U.S. Pat. No. 4,710,589 to Meyers et al teaches a photovoltaic cell having an n-type layer of cadmium sulfide deposited by vacuum evaporation or a narrow gap reactor, an intrinsic layer of electrodeposited cadmium tellurium, and a p-type layer of zinc tellurium deposited by vacuum evaporation.

DC and RF sputtering are widely used techniques for the deposition of thin films for insulators and metals. However, the use of sputtering techniques for photovoltaic cells has not tested or utilized.

In most RF sputtering systems a cathode and an anode are positioned in an atmosphere of heavy gas, such as argon. A radio frequency field is established between the cathode and the anode for the sputtering of materials. The cathode is the target and is made up of the materials to be sputtered. The anode is the electrode toward which the molecules of the target are driven for deposit. In planar magnetron sputtering, the anode consists of a ring-shaped electrode with diameter slightly larger than the circular target. Permanent magnets are placed under the target, thereby creating a magnetic field which serves to constrain the electron and ion paths. When the RF voltage is applied between the target (typically negative) and the anode ring (typically grounded positive), the electrons are concentrated in a circular orbit a few millimeters above the target. This type of magnetron sputtering gun has the advantage of minimizing the bombardment of the substrate with electrons and ions, often improving the film characteristics.

The frequencies at which sputtering machines may operate are established by the Federal Communications Commission. The frequencies include 13.56 megahertz and the second and third harmonics of that frequency.

Large sputtering machines are not limited in processing to the size of the pressure chamber. Air or pressure locks in the walls of the pressure chamber enable continuous sputtering upon a pass-through substrate without opening the chamber.

U.S. Pat. No. 5,105,310 to Dickey discloses a method for depositing a multi-layer antireflection coating on a transparent substrate by DC sputtering. DC sputtering is often used for large scale commercial applications. In line vacuum chambers are provided for multiple layers.

A process for the sputter deposition of dielectric materials, such as aluminum oxide, is disclosed in U.S. Pat. No. 4,420,385 to Hartsough. U.S. Pat. No. 4,392,931 to Maniv et al also teaches a sputtering system designed primarily for oxides.

U.S. Pat. No. 4,415,427 to Hidler teaches a planar magnetron sputtering means having a defined plasma area. The host target material and a dopant material are disposed in the magnetron area and are deposited at the same time.

It is often difficult with the known RF sputtering systems to obtain a thin film with controlled resistivity, transparency, and composition for use in semiconductor applications. U.S. Pat. No. 4,398,055 to Ijaz et al discloses the sputtering of a photovoltaic layer of a polycrystalline film consisting of cadmium, silicon, and arsenide.

U.S. Pat. No. 4,284,490 to Weber provides details regarding the equipment and processes that are utilized to sputter at a RF in the megahertz range.

SUMMARY OF THE INVENTION

In accordance with the present invention, a thin film photovoltaic cell having a semiconductor layer of cadmium sulfide and a semiconductor layer of cadmium telluride is manufactured in a process in which the cadmium sulfide and the cadmium telluride are deposited onto a conductive layer of a substrate by RF sputtering using a planar magnetron sputtering gun.

The photovoltaic cell of the present invention includes a glass substrate having a transparent conducting layer, such as tin oxide. A layer of cadmium sulfide is then deposited on the conducting layer by RF sputtering. The RF sputtering provides a thin layer of cadmium sulfide which may be heavily doped to minimize ohmic losses. The RF sputtering process is suitable and cost effective for large scale production operations.

After the cadmium sulfide is deposited, a layer of cadmium telluride is deposited using RF sputtering. Cadmium telluride is ideal for absorbing light from the solar spectrum. The RF sputtering deposition of the two semiconductor layers increases the efficiency of the cell and is conducive to a large scale manufacturing process.

The photovoltaic cell may include only two semiconductor layers forming a p-n junction. A third semiconductor layer, typically zinc telluride, may be added to the cell to form a p-i-n junction.

One of the limitations of the output of the cell is the crystal grain size of the cadmium telluride. The efficiency of the cell can be increased significantly by treatment with cadmium chloride and annealing in dry air. The cadmium chloride is deposited using laser-driven physical vapor deposition. The cell is then annealed at approximately 400 degrees Celsius in air prior to deposition of the second contact.

The second contact is deposited using vacuum evaporation of copper and gold. The multi-layer contact provides a stable contact with the cadmium telluride and an efficient contact for electrical conductivity.

An object of the present invention is to provide a photovoltaic cell with improved efficiency. The majority of the polycrystalline cells have efficiencies in the 5 to 10% range. The present invention will be able to obtain efficiencies in the 10 to 15% range.

A further object of the present invention is to develop a process which is practical and cost effective from a manufacturing standpoint. In order to make energy production from photovoltaic cells a viable energy option, the cells must be producible on a full scale manufacturing operation at an inexpensive price.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
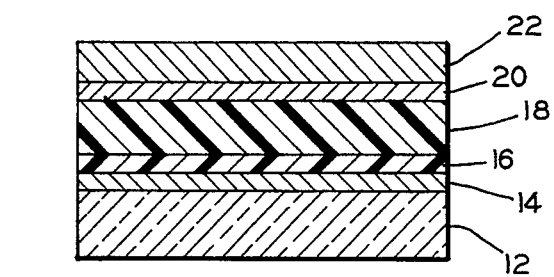
FIG. 1 is a cross-sectional diagrammatic view of the photovoltaic cell of the present invention having two semiconductor layers.

Referring now to the drawings, FIG. 1 shows a completed photovoltaic cell device 10 having two layers of semiconductor material. The cell 10 includes a substrate 12 on which an electrically conductive layer 14 is disposed to provide ohmic contact. The semiconductor layers 16 and 18 forming the n-p junction are disposed on conductive layer 14. The final two layers 20 and 22 are conductive layers and form a multi-layer ohmic contact.

Figure 2:
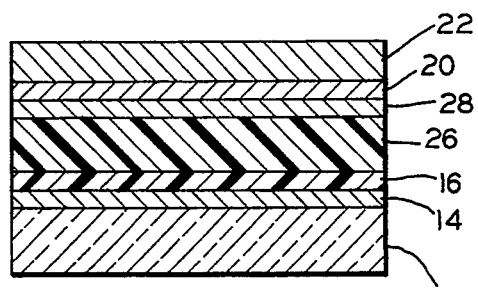
FIG. 2 is a cross-sectional diagrammatic view of an alternative embodiment of the present invention having three semiconductor layers.

FIG. 2 discloses a cell 24 provided with three semiconductor layers 16, 26, and 28 to form a p-i-n junction. Semiconductor layer 26 is the intrinsic layer, which absorbs light and layers 16 and 28 provide an electric field which assists movement of the positive and negative charge carriers. The substrate 12, conductive layers 14, 20, and 22, and the first semiconductor layer 16 are the same for both cells 10 and 24.

Substrate 12 may be transparent, such as glass, or may be opaque, such as stainless steel. When the substrate 12 is transparent, light passes through the substrate 12 and through a transparent conductive layer 14 into semiconductor layer 16. Transparent, electrically conductive oxides, such as tin oxide, may be used for the conductive layer 14.

When an opaque substrate 12 is provided, the cell 10 is inverted and light enters semiconductor 18 through conductor layers 20 and 22, which are transparent and/or disposed in a grid-like fashion. When an opaque substrate 12 is utilized, the electrically conducting layer 14 may be unnecessary.

The semiconductor layers are formed from the II-VI compounds, which are well known for their use in photovoltaic applications. In the preferred embodiment of the present invention, the semiconductor layer 16 is an n-type layer formed from cadmium sulfide. The p-type layer 18 is formed from cadmium telluride. Cadmium telluride is self-compensating and may be doped to form the p-type layer 18.

In cell 24 of FIG. 2, the semiconductor layer 16 is the same n-type layer formed from cadmium sulfide. Cadmium telluride is the preferred semiconductor for the intrinsic layer 26. Zinc telluride is employed as the p-type layer 28. Other II-VI polycrystalline semiconductors may be used for the three semiconductor layers 16, 26, and 28.

The manufacturing process starts with a glass substrate and the application of the first conductive coating. A transparent oxide coating, such as tin oxide, is applied to the glass.

The next step in the process is the depositing of the first semiconductor layer. Cadmium sulfide is deposited using RF sputtering techniques. It is desirable that the cadmium sulfide layer be as thin as possible to minimize the amount of light absorbed in the top layer. The cadmium sulfide may also be doped to minimize ohmic losses.

Figure 3:
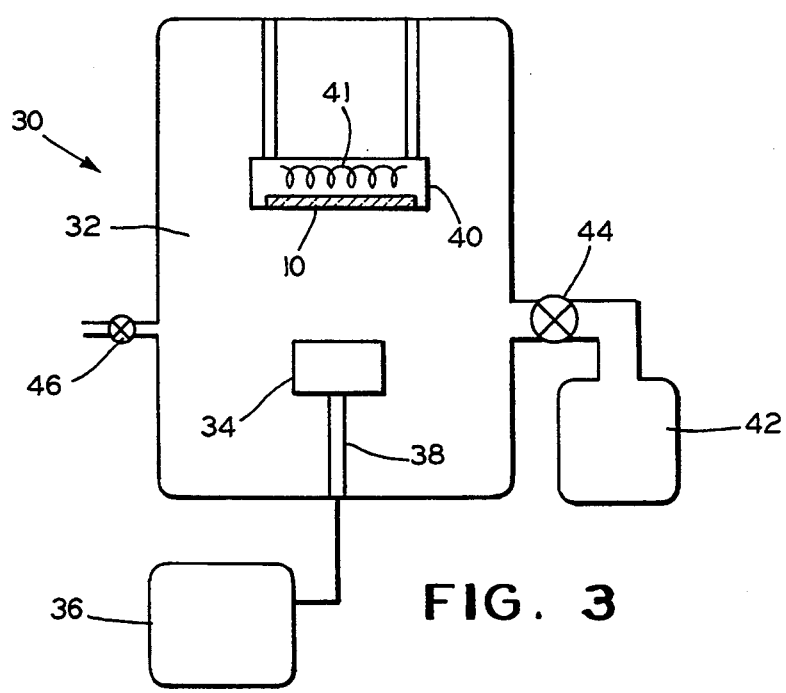
FIG. 3 is a partial schematic sectional view of a chamber suitable for sputter depositing cadmium telluride, cadmium sulfide, and other semiconductors onto a substrate.

The RF sputtering system 30 for both the cadmium sulfide and the cadmium telluride, as shown in FIG. 3, typically includes a stainless steel vacuum chamber 32. The sputtering system utilizes a 13.56 megahertz generator and power monitor 36 with a network impedance matching system. The impedance of the load circuit should match the impedance of the power generator to improve power utilization in the system 30. The power rating of the generator will be between 150 to 500 watts for two inch diameter targets. For larger targets and substrates, the power should be scaled approximately in proportion to the area.

The sputtering source 34 is connected to the generator and power monitor 36. The sputtering source 34 includes a planar magnetron sputter gun and the target for sputtering operations. The sputtering source 34 is mounted on a support 38 extending into the vacuum chamber 32. The target material is pressed and sintered cadmium sulfide or cadmium telluride prepared from powder. The sputtering gun includes an anode ring which is slightly larger than the target.

The substrate holder 40 is typically grounded and includes a tantalum wire heater 41 for radiatively heating the substrate 12 of cell 10 and its holder 40. For a two inch diameter sputtering target and a four inch square substrate, the typical distance from the target in sputtering source 34 to the substrate of cell 10 is three inches. Ionized atoms of the sputter gas, argon, are driven into the target causing backward sputtering of the target atoms onto the heated substrate. The sputter gun and substrate can be operated in any orientation relative to the earth's gravity.

The proper background gas must be present in the chamber 32 to facilitate the formation of a sputtering plasma between the anode and the cathode. The sputtering system 30 utilizes an atmosphere of gas having heavy ions, such as argon. The turbo pump 42 draws a vacuum when gate valve 44 is opened. Argon is supplied through needle valve 46. The argon gas is furnished at a low pressure of approximately 5 milli-Torrs. The pressure may vary over a range of 1–15 milli-Torrs. The flow rate for the argon gas is optimal at approximately 20 standard cubic centimeters per minute.

To deposit the semiconductor layer of cadmium sulfide, the substrate 12 with conductive layer 14 is placed in the chamber for 10 to 90 minutes. The thickness of the cadmium sulfide will be between 0.05 and 0.5 microns depending on the sputtering time.

After the cadmium sulfide has been deposited, the cadmium telluride is deposited using the same sputter deposition method. The target in the sputtering source 34 is changed to cadmium telluride for this step. The sputtering is continued until a thickness of 1.0 to 1.5 microns is obtained.

The efficiency of the cell 10 may be improved significantly by the next processing step, the laser-driven physical vapor deposition of cadmium chloride. This process occurs in a vacuum chamber similar to chamber 32. A pulsed laser, such as a xenon chloride excimer laser, is directed at a target of powdered cadmium chloride. The laser is operated in pulses of nanosecond duration. The cadmium chloride treatment increases the crystal grain size, which results in increased efficiency of the cell 10.

After deposition of the cadmium chloride, the cell 10 is annealed at 400 degrees Celsius for 30 minutes in dry air. The annealing process can be varied over the range to 300 to 500 degrees Celsius for 10 to 30 minutes to achieve the optimum annealing. If cadmium chloride residue is a problem, the cell 10 may be washed to dissolve the residual cadmium chloride with deionized water.

In addition to the steps outlined above, one additional step is required in the manufacture of the cell 24 with three semiconductor layers. The third layer 28 is typically formed using zinc telluride. The sputtering system 30 is used to deposit the zinc telluride in layer 28. In cell 24 with the p-i-n configuration, the cadmium telluride layer 26 is the intrinsic layer and is maintained at a thickness of 1.0 to 1.5 microns. The zinc telluride layer 28 is typically 0.2 to 0.5 microns thick.

After the semiconductor layers have been deposited, the second conductor is formed to complete the cell 10. The preferred conductor is a two layer ohmic contact. The first layer is a layer of copper 20 having a thickness of approximately 30 Angstroms. The copper is vacuum evaporated onto the surface of the p-type semiconductor, the cadmium telluride film 18, and provides a stable ohmic contact. However, there is not enough copper to cause shorting across the film 18.

The thin copper layer 20 is not an adequate current collector. A second layer 22 of metal is formed on the copper layer 20 to facilitate current collection. The preferred metal for layer 22 is gold with a thickness of approximately 200 Angstroms. Other metals, such as nickel and chromium are also acceptable. Vacuum evaporation is also used to deposit the layer 22 of gold.

Photovoltaic cells 10 of the present invention having cadmium sulfide and a cadmium telluride semiconductor deposited by RF sputtering have provided superior efficiency compared to other polycrystalline cells. Various property measurements have been made on the cells 10 of the present invention.

Figure 4:
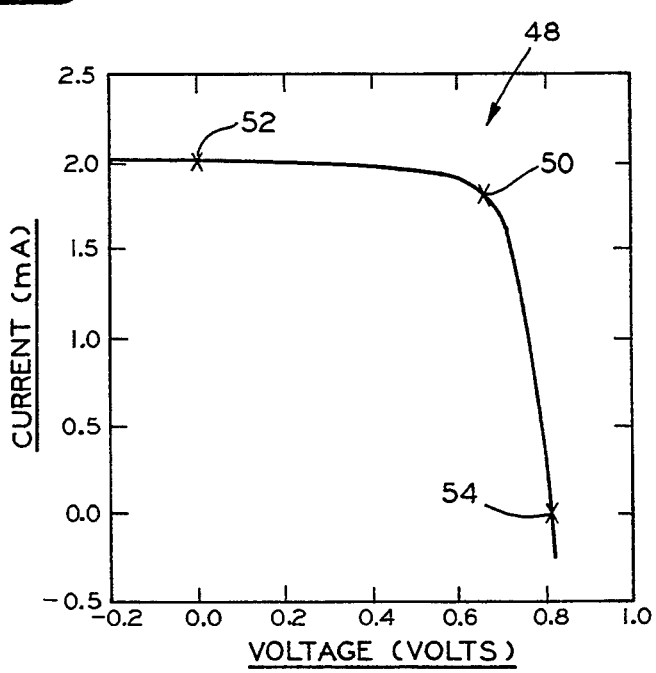
FIG. 4 is a plot of the voltage and current characteristics of a photovoltaic cell in which a cadmium sulfide and cadmium telluride junction is formed according to the present invention.

The voltage-current characteristics of the photovoltaic cell 10 are shown in FIG. 4. The maximum power is achieved at point 50 of the graph where the maximum power equals 1.193 milli-watts (1.805 milliamps at 0.6607 volts). The open circuit voltage 54 is equal to 0.815 volts. The short circuit current 52 is equal to 2.01 milliamps. The short circuit current density equals 17.61 milliamps per square centimeter. The fill factor equals 0.728 and the efficiency equals 10.4%. Higher efficiencies in the range of 12% to 14% should be achievable on a regular basis once the sputtering and annealing processes have been optimized through further testing.

The method of forming a photovoltaic cell is well suited for large scale production operations. Sputtering has been implemented on a number of large surface filming processes in the glass industry. Large sputtering machines are not limited in processing to the size of the pressure chamber 32. Air or pressure locks (not shown) in the walls of the pressure chamber enable continuous sputtering upon a pass-through substrate without opening the chamber. A number of pressure chambers may be arranged in series to permit the continuous manufacture of cells as the substrate is passed through the chambers. All of the process steps listed above are suited for a high volume production line which could produce an efficient cell at a cost that is very competitive with other means for manufacturing the cells. There are no liquid baths required for depositing the semiconductors, and operating problems and adjustments should be minimal once the system is set up.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for making a photovoltaic cell, said method comprising the steps of:
   a) providing a substrate;
   b) depositing a conductive layer onto the substrate;
   c) positioning said substrate in a pressure chamber and operating a planar magnetron sputtering system for RF sputtering cadmium sulfide onto the conductive layer of the substrate to form a cadmium sulfide film having a thickness of about 0.05 to 0.5 microns;
   d) positioning said substrate in a pressure chamber and operating a planar magnetron sputtering system for RF sputtering cadmium telluride onto the cadmium sulfide film to form a cadmium telluride film having a thickness of about 1.0 to 1.5 microns;
   e) depositing cadmium chloride onto the cadmium telluride film to treat the cadmium telluride film, said cadmium chloride being deposited using laser-driven physical vapor deposition of a cadmium chloride target;
   f) annealing the cell in dry air at a temperature between 300 and 500 degrees Celsius for a period of 30 to 60 minutes, whereby the grain size of the cadmium telluride is increased and the resistivity of the cadmium telluride is decreased; and
   g) evaporating a metal on the cadmium telluride film to form a second conductive layer, whereby a photovoltaic cell with an efficiency of at least 10% is formed.

2. The method according to claim 1 including the additional step of, after the RF sputtering of the cadmium telluride, operating a planar magnetron sputtering system for RF sputtering zinc telluride onto the cadmium telluride film to form a zinc telluride film and then evaporating a conductive metal on the zinc telluride film.

3. The method according to claim 1 wherein the substrate is a transparent glass substrate and the conductive layer is a transparent tin oxide layer.

4. The method according to claim 1 including the additional steps of, after annealing the cell, washing the cell with deionized water to dissolve the residual cadmium chloride remaining on the cadmium telluride film.

5. The method according to claim 1 wherein operating a planar magnetron sputtering system includes positioning a magnetron sputter gun and target within inches of the substrate in an atmosphere of argon gas within the pressure chamber.

6. The method according to claim 5 wherein said cadmium telluride and said cadmium sulfide are RF sputtered using a magnetron sputter gun rated up to 500 watts for a two inch gun.

7. The method according to claim 1 wherein the step of RF sputtering of the cadmium sulfide and the cadmium telluride occurs in a pressure chamber in an atmosphere of argon gas, said argon gas being supplied to the pressure chamber at a pressure range of 1 to 15 milli- Torrs with a flow rate of approximately 20 standard cubic centimeters per minute.

8. The method according to claim 1 wherein evaporating a metal on the cadmium telluride to form a second conductive layer includes the evaporation of two metals to form two separate layers on the cadmium telluride.

9. The method according to claim 8 wherein copper is the first metal evaporated to form a conductive layer on the cadmium telluride and gold is the second metal evaporated to form a conductive layer.

10. The method according to claim 9 wherein the copper is formed with a thickness of approximately 30 Angstroms and the gold is formed to a thickness of approximately 200 Angstroms.

* * * * *

UNITED STATES PATENT AND TRADEMARK OFFICE
CERTIFICATE OF CORRECTION

PATENT NO. : 5,393.675

DATED : February 28, 1995

INVENTOR(S): Alvin D. Compaan

It is certified that error appears in the above-identified patent and that said Letters Patent is hereby corrected as shown below:

column 1, line 1 insert the following paragraph:

"This invention was made with Government support under Subcontract No. NREL-ZN-O-19019-3 awarded by the U.S. Department of Energy. The Government has certain rights in the invention."

Signed and Sealed this

First Day of June, 1999

Attest:

Q. TODD DICKINSON

*Attesting Officer*       *Acting Commissioner of Patents and Trademarks*